United States Patent
Huang

(10) Patent No.: US 12,266,926 B2
(45) Date of Patent: Apr. 1, 2025

(54) ELECTRICAL DISCHARGE CIRCUIT HAVING STABLE DISCHARGING MECHANISM

(71) Applicant: REALTEK SEMICONDUCTOR CORPORATION, Hsinchu (TW)

(72) Inventor: Chung-Yu Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 223 days.

(21) Appl. No.: 18/077,265

(22) Filed: Dec. 8, 2022

(65) Prior Publication Data
US 2023/0187928 A1    Jun. 15, 2023

(30) Foreign Application Priority Data
Dec. 14, 2021   (TW) .................................. 110146779

(51) Int. Cl.
*H02H 9/00* (2006.01)
*H02H 9/04* (2006.01)
*H03K 17/687* (2006.01)

(52) U.S. Cl.
CPC ......... *H02H 9/046* (2013.01); *H03K 17/6872* (2013.01)

(58) Field of Classification Search
CPC ........................... H02H 9/046; H03K 17/6872
USPC .......................................................... 361/56
See application file for complete search history.

(56) References Cited

U.S. PATENT DOCUMENTS

| | | | |
|---|---|---|---|
| 6,650,168 B1* | 11/2003 | Wang | H03K 17/102 327/333 |
| 2014/0368958 A1* | 12/2014 | Ikimura | H02H 9/046 361/56 |
| 2016/0087429 A1* | 3/2016 | Wang | H02H 9/046 361/56 |
| 2021/0242677 A1* | 8/2021 | Langguth | H02H 9/046 |
| 2021/0343702 A1* | 11/2021 | Xu | H01L 27/0288 |

* cited by examiner

*Primary Examiner* — Jared Fureman
*Assistant Examiner* — Lucy M Thomas
(74) *Attorney, Agent, or Firm* — WPAT, PC

(57) ABSTRACT

The present invention discloses an electrical discharge circuit having stable discharging mechanism is provided. A voltage division circuit generates a detection signal based on a voltage input terminal such that a first inverter outputs an inverted detection signal. First PMOS and NMOS circuits are coupled in series between a voltage input terminal and a ground terminal through a first terminal. Second PMOS and NMOS circuits are coupled in series between the voltage input terminal and the ground terminal through a second terminal. A first and a second PMOS control terminals are coupled to the second terminal and the first terminal respectively. A first and a second NMOS control terminals receive the inverted detection signal and the detection signal respectively. A second inverter receives an inverted boost detection signal from the second terminal and outputs a boost detection signal. AN ESD transistor is turned off due to the boost detection signal to discharge the voltage input terminal.

8 Claims, 2 Drawing Sheets

ELECTRICAL DISCHARGE CIRCUIT HAVING STABLE DISCHARGING MECHANISM

BACKGROUND OF THE INVENTION

1. Field of the Invention

The present invention relates to an electrical discharge circuit having stable discharging mechanism.

2. Description of Related Art

Electrostatic discharge (ESD) may cause permanent damage to electronic components such that the circuit function of an integrated circuit is affected and can not operate properly.

ESD may occur during the manufacturing, packaging, testing, storing or moving of chips. In order to recreate and prevent ESD, integrated circuit products may use ESD protection components or circuits and apply test thereon to optimize the protection of the integrated circuits against ESD, so as to increase the yield of the electronic products.

SUMMARY OF THE INVENTION

In consideration of the problem of the prior art, an object of the present invention is to supply an electrical discharge circuit having stable discharging mechanism.

The present invention discloses an electrical discharge circuit having stable discharging mechanism that includes a voltage division circuit, a first inverter, a voltage boosting circuit, a second inverter and an ESD transistor. The voltage division circuit is electrically coupled to a voltage input terminal and is configured to receive a power signal to generate a detection signal at a voltage division terminal. The first inverter is configured to receive and invert the detection signal to output an inverted detection signal. The voltage boosting circuit includes a first PMOS circuit, a first NMOS circuit, a second PMOS circuit and a second NMOS circuit. The first PMOS circuit and the first NMOS circuit are coupled in series through a first terminal between the voltage input terminal and a ground terminal, wherein the first PMOS circuit includes a first PMOS control terminal electrically coupled to a second terminal and the first NMOS circuit includes a first NMOS control terminal configured to receive the inverted detection signal. The second PMOS circuit and the second NMOS circuit are coupled in series through the second terminal between the voltage input terminal and the ground terminal, wherein the second PMOS circuit includes a second PMOS control terminal electrically coupled to the first terminal and the second NMOS circuit includes a second NMOS control terminal configured to receive the detection signal. The second inverter is electrically coupled between the voltage input terminal and the ground terminal and is configured to receive and invert an inverted boost detection signal from the second terminal to output a boost detection signal. The ESD transistor is electrically coupled between the voltage input terminal and the ground terminal and is configured to be controlled by the boost detection signal, such that the ESD transistor is turned off due to the boost detection signal to discharge the voltage input terminal.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide an electrical discharge circuit having stable discharging mechanism to directly detect the voltage variation caused by the ESD input by disposing a voltage division circuit without the limitation of the RC circuit in conventional design. The electrical discharge circuit can quickly response and maintain a long enough discharging time to stabilize the discharging behavior of a discharging transistor.

Figure 1:
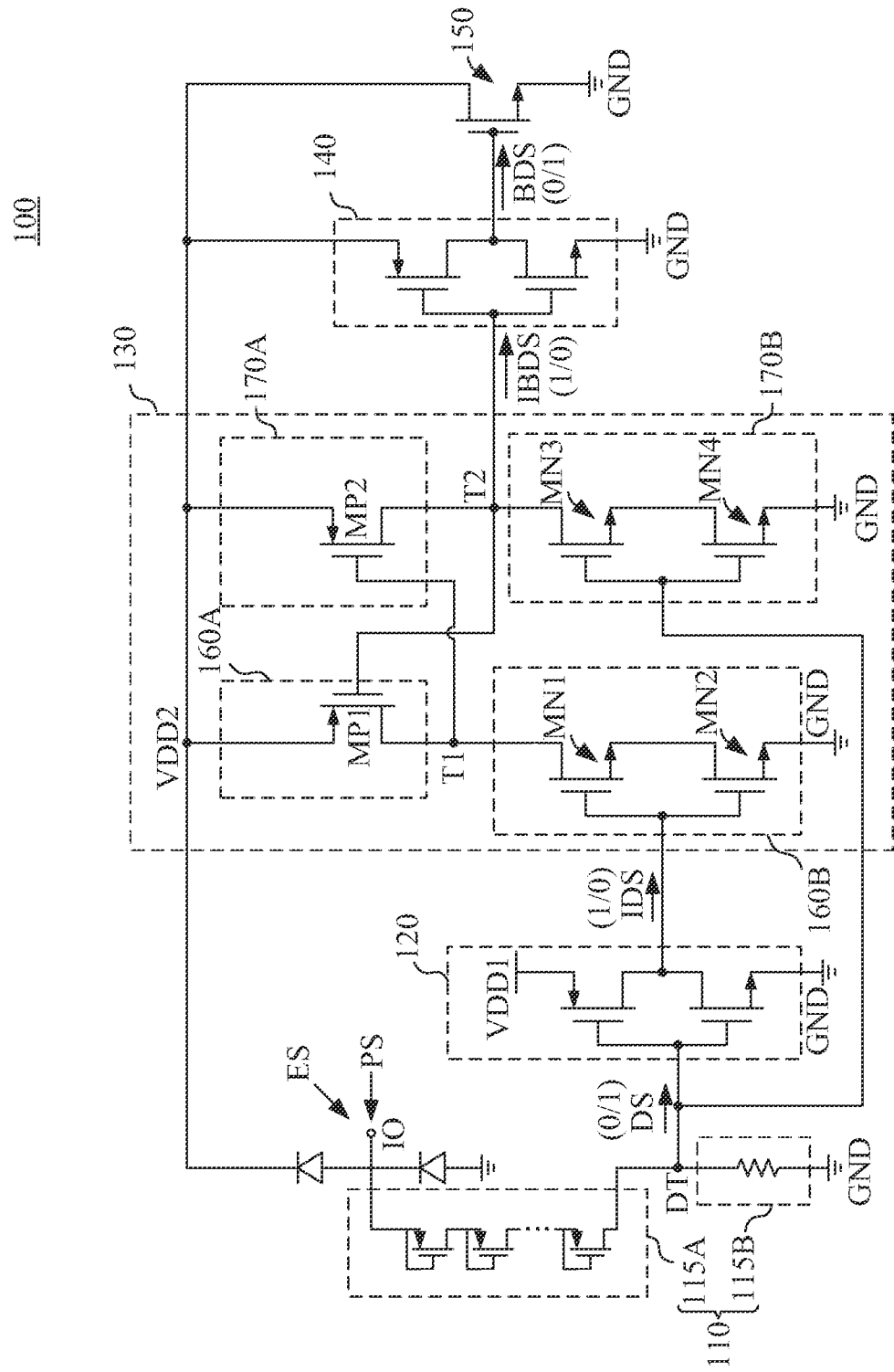
FIG. 1 illustrates a circuit diagram of an electrical discharge circuit having stable discharging mechanism according to an embodiment of the present invention.

Reference is now made to FIG. 1. FIG. 1 illustrates a circuit diagram of an electrical discharge circuit 100 having stable discharging mechanism according to an embodiment of the present invention. The electrical discharge circuit 100 includes a voltage division circuit 110, a first inverter 120, a voltage boosting circuit 130, a second inverter 140 and an ESD transistor 150.

The voltage division circuit 110 is electrically coupled to a voltage input terminal IO configured to receive a power signal PS to generate a detection signal DS at a voltage division terminal DT.

In an embodiment, the voltage division circuit 110 includes a first resistive circuit 115A and a second resistive circuit 115B coupled in series through the voltage division terminal DT between the voltage input terminal IO and a ground terminal GND.

The first resistive circuit 115A includes a resistor, a diode, a diode-connected transistor or a combination thereof. The number of the components described above can be one or more than one. When the number is more than one, the components can be coupled in series. In FIG. 1, the first resistive circuit 115A is exemplarily illustrated to include a plurality of diode-connected P-type transistors. The second resistive circuit 115B is exemplarily illustrated to include a single resistor. In other embodiments, other components described above, a diode-connected N-type transistor or other combinations of the components described above can be used. The present invention is not limited thereto.

In an embodiment, the electrical discharge circuit 100 can be disposed in an electronic apparatus (not illustrated) and receive the power signal PS through the voltage input terminal IO during the operation of the electronic apparatus. The detection signal DS can thus be generated at the voltage division terminal DT according to the resistance ratio between the first resistive circuit 115A and the second resistive circuit 115B.

The first inverter 120 operates according to a first voltage VDD1. The voltage boosting circuit 130, the second inverter 140 and the ESD transistor 150 operate according to a second voltage VDD2. The first voltage VDD1 is smaller than the second voltage VDD2. In an embodiment, the first voltage VDD1 is such as, but not limited to 0.9, 1.2 or 1.8 volts. The second voltage VDD2 is such as, but not limited to 3.3 volts.

The second voltage VDD2, in the present embodiment, is generated according to the power signal PS. More specifically, in an embodiment, the voltage boosting circuit 130, the second inverter 140 and the ESD transistor 150 are electrically coupled to the voltage input terminal IO to receive the power signal PS. Between the components described above and the voltage input terminal IO, other electrical components may be included without affecting the function of the electrical discharge circuit 110.

In different embodiments, the first voltage VDD1 can selectively be generated according to another power signal from another independent voltage source or by dividing the power signal PS.

As a result, the internal components (e.g., transistors) of the first inverter 120 have a relatively lower threshold voltage. The internal components (e.g., transistors) of the voltage boosting circuit 130, the second inverter 140 and the ESD transistor 150 have a relatively higher threshold voltage. The first inverter 120 has a response speed higher than that of the voltage boosting circuit 130, the second inverter 140 and the ESD transistor 150.

The first inverter 120 is configured to receive and invert the detection signal DS to output an inverted detection signal IDS.

The voltage boosting circuit 130 is configured to generate an inverted boost detection signal IBDS according to the detection signal DS and the inverted detection signal IDS. In an embodiment, the voltage boosting circuit 130 includes a first PMOS circuit 160A, a first NMOS circuit 160B, a second PMOS circuit 170A and a second NMOS circuit 170B.

In the embodiment of FIG. 1, the first PMOS circuit 160A includes a P-type transistor MP1. The first NMOS circuit 160B includes a first N-type transistor MN1 and a second N-type transistor MN2 coupled in series. The second PMOS circuit 170A includes a P-type transistor MP2. The second NMOS circuit 170B includes a first N-type transistor MN3 and a second N-type transistor MN4 coupled in series.

The first PMOS circuit 160A and the first NMOS circuit 160B are coupled in series through a first terminal T1 between the voltage input terminal IO and the ground terminal GND. The first PMOS circuit 160A has a first PMOS control terminal electrically coupled to a second terminal T2. The first NMOS circuit 160B has a first NMOS control terminal configured to receive the inverted detection signal IDS.

More specifically, in the embodiment in FIG. 1, the source of the P-type transistor MP1 is electrically coupled to the voltage input terminal IO. The drain of the P-type transistor MP1 is electrically coupled to the first terminal T1. The gate of the P-type transistor MP1 operates as a first PMOS control terminal electrically coupled to the second terminal T2. The drain of the first N-type transistor MN1 is electrically coupled to the first terminal T1. The source of the first N-type transistor MN1 is electrically coupled to the drain of the N-type transistor MN2. The drain of the second N-type transistor MN2 is electrically coupled to the source of the N-type transistor MN1. The source the second N-type transistor MN2 is electrically coupled to the ground terminal GND. The gates of the first N-type transistor MN1 and the second N-type transistor MN2 are electrically coupled and operate as a first NMOS control terminal to receive the inverted detection signal IDS.

The second PMOS circuit 170A and the second NMOS circuit 170B are coupled in series through the second terminal T2 between the voltage input terminal IO and the ground terminal GND. The second PMOS circuit 170A has a second PMOS control terminal electrically coupled to the first terminal T1. The second NMOS circuit 170B has a second NMOS control terminal configured to receive the detection signal DS.

More specifically, in the embodiment in FIG. 1, the source of the P-type transistor MP2 is electrically coupled to the voltage input terminal IO. The drain of the P-type transistor MP2 is electrically coupled to the second terminal T2. The gate of the P-type transistor MP2 operates as a second PMOS control terminal electrically coupled to the first terminal T1. The drain of the first N-type transistor MN3 is electrically coupled to the second terminal T2. The source of the first N-type transistor MN3 is electrically coupled to the drain of the second N-type transistor MN4. The drain of the second N-type transistor MN4 is electrically coupled to the source of the first N-type transistor MN3. The source of the Second N-type transistor MN4 is electrically coupled to the ground terminal GND. The gates of the first N-type transistor MN3 and the second N-type transistor MN4 are electrically coupled and operate as a second NMOS control terminal to receive the detection signal DS.

In an embodiment, each of the first N-type transistors MN1 and MN3 is an I/O device that is able to withstand a higher voltage (e.g., 3.3 volts). Each of the second N-type transistors MN2 and MN4 is a core device that is only able to withstand a lower voltage (0.9, 1.2 or 1.8 volts). By using such a configuration, the first NMOS circuit 160B and the second NMOS circuit 170B have a better reliability.

In an embodiment, the first NMOS circuit 160B may selectively include an N-type transistor (not illustrated) coupled in series with the first N-type transistor MN1 and the second N-type transistor MN2 and controlled by another control signal. When the sources of the first voltage VDD1 and the second voltage VDD2 are different, such an N-type transistor can be turned on according to the said control signal after the first voltage VDD1 and the second voltage VDD2 are fully provided by the respective sources. The unknown state in the first NMOS circuit 160B generated due to the order of the presence of the first voltage VDD1 and the second voltage VDD2 (since the sources thereof may not be powered on simultaneously) can be avoided. Identically, the second NMOS circuit 170B may include the same configuration. The detail is not described herein.

The second inverter 140 is electrically coupled between the voltage input terminal IO and the ground terminal GND and is configured to receive and invert the inverted boost detection signal IBDS from the second terminal T2 to output a boost detection signal BDS.

The ESD transistor 150 is electrically coupled between the voltage input terminal IO and the ground terminal GND and is configured to be controlled by the boost detection signal BDS, such that the ESD transistor 150 is turned on due to the boost detection signal BDS to discharge the voltage input terminal IO. In the present embodiment, the ESD transistor 150 is an N-type transistor. In other embodiments, the electrical discharge circuit 100 may dispose another inverter between the ESD transistor 150 and the second inverter 140 such that the ESD transistor 150 is implemented by a P-type transistor. The present invention is not limited thereto.

A normal operation mode and a discharging mode that the electrical discharge circuit 100 operates according to different amounts of the voltage at the voltage input terminal IO are described in detail in the following paragraphs. In FIG. 1, a plurality of sets of labels of logic levels of the voltages, including a high state level labeled as "1" and a low state level labeled as "0", are used to label the logic levels at various circuit nodes in the normal operation mode and the discharging mode. Moreover, in FIG. 1, each set of labels include a first value and a second value, in which the first value corresponds to the normal operation mode and the second value corresponds to the discharging mode.

When a voltage amount of the voltage input terminal IO does not exceed a predetermined level, e.g., under the condition that the voltage input terminal IO only receives the power signal PS without receiving an ESD input ES generated due to actual occurrence of electrostatic charges or electrical over shoot (EOS), the electrical discharge circuit 100 operates in the normal operation mode. Under such a condition, the detection signal DS generated at the voltage division terminal DT by the voltage division circuit 110 is at the low state level (0). The inverted detection signal IDS is at the high state level (1) due to the operation of the first inverter 120.

According to the inverted detection signal IDS at the high state level and the detection signal DS at the low state level, the second PMOS circuit 170A and the first NMOS circuit 160B are turned on and the first PMOS circuit 160A and the second NMOS circuit 170B are turned off.

More specifically, the first N-type transistor MN1 and the second N-type transistor MN2 in the first NMOS circuit 160B are turned on due to the inverted detection signal IDS at the high state level, so as to drain current from the first terminal T1 such that the voltage at the first terminal T1 drops to the low state level (0) to further turn on the P-type transistor MP2 in the second PMOS circuit 170A. The first N-type transistor MN3 and the second N-type transistor MN4 in the second NMOS circuit 170B are turned off due to the detection signal DS at the low state level such that the second terminal T2 receives the current from the P-type transistor MP2 to increase the voltage at the second terminal T2 to the high state level (1), to further turn off the P-type transistor MP1 in the first PMOS circuit 160A.

The inverted boost detection signal IBDS generated by the second terminal T2 is therefore at the high state level (1). The boost detection signal BDS is at the low state level (0) due to the operation of the second inverter 140 to further turn off the ESD transistor 150.

On the other hand, when the voltage amount of the voltage input terminal IO exceeds the predetermined level, e.g., under the condition that the voltage input terminal IO not only receives the power signal PS but also receives the ESD input ES having an instant large current, the electrical discharge circuit 100 operates in the discharging mode. Under such a condition, the detection signal DS generated at the voltage division terminal DT by the voltage division circuit 110 is at the high state level (1). The inverted detection signal IDS is at the low state level (0) due to the operation of the first inverter 120.

According to the inverted detection signal IDS at the low state level and the detection signal DS at the high state level, the second PMOS circuit 170A and the first NMOS circuit 160B are turned off and the first PMOS circuit 160A and the second NMOS circuit 170B are turned on.

More specifically, the first N-type transistor MN3 and the second N-type transistor MN4 in the second NMOS circuit 170B are turned on due to the detection signal DS at the high state level, so as to drain current from the second terminal T2 such that the voltage at the second terminal T2 drops to the low state level (0) to further turn on the P-type transistor MP1 in the first PMOS circuit 160A. The first N-type transistor MN1 and the second N-type transistor MN2 in the first NMOS circuit 160B are turned off due to the inverted detection signal IDS at the low state level, such that the first terminal T1 receives the current from the P-type transistor MP1 to increase the voltage at the first terminal T1 to the high state level (1), to further turn off the P-type transistor MP2 in the second PMOS circuit 170A.

The inverted boost detection signal IBDS generated by the second terminal T2 is therefore at the low state level (0). The boost detection signal BDS is at the high state level (1) due to the operation of the second inverter 140 to further turn on the ESD transistor 150 to discharge the voltage input terminal IO.

It is appreciated that, after the ESD transistor 150 discharges the voltage input terminal IO for a certain period of time such that the voltage at the voltage input terminal IO drops and further makes the detection signal DS, which is divided from the voltage at the voltage input terminal IO, back to the low state level (0), the electrical discharge circuit 110 operates in the normal operation mode again.

In some approaches, the electrical discharge circuit uses a RC circuit to be coupled to the ESD input to control the inverter to determine whether the discharging transistor is activated. When the RC circuit is used, whether the ESD discharging mechanism is activated relies on the signal frequency of the ESD input. When the duration of the ESD input is not long enough or when the energy of the ESD input is not large enough, the RC circuit that is fully charged responses slowly such that the turn-on time is relatively late and the discharging activity can not be maintained for a long enough time. Further, under such a condition, the discharging circuit needs to operate according to a breakdown mechanism. An uneven turn-on behavior is generated.

As a result, the electrical discharge circuit directly detects the voltage variation caused by the ESD input by disposing a voltage division circuit without the limitation of the RC circuit in conventional design. The electrical discharge circuit can quickly response and maintain a long enough discharging time to stabilize the discharging behavior of a discharging transistor.

It is appreciated that the number of the transistors included in each of the first PMOS circuit 160A, the first NMOS circuit 160B, the second PMOS circuit 170A and the second NMOS circuit 170B is merely an example In other embodiments, the number of the transistors included in these circuits can be modified according to practical requirements. The present invention is not limited thereto.

Figure 2:
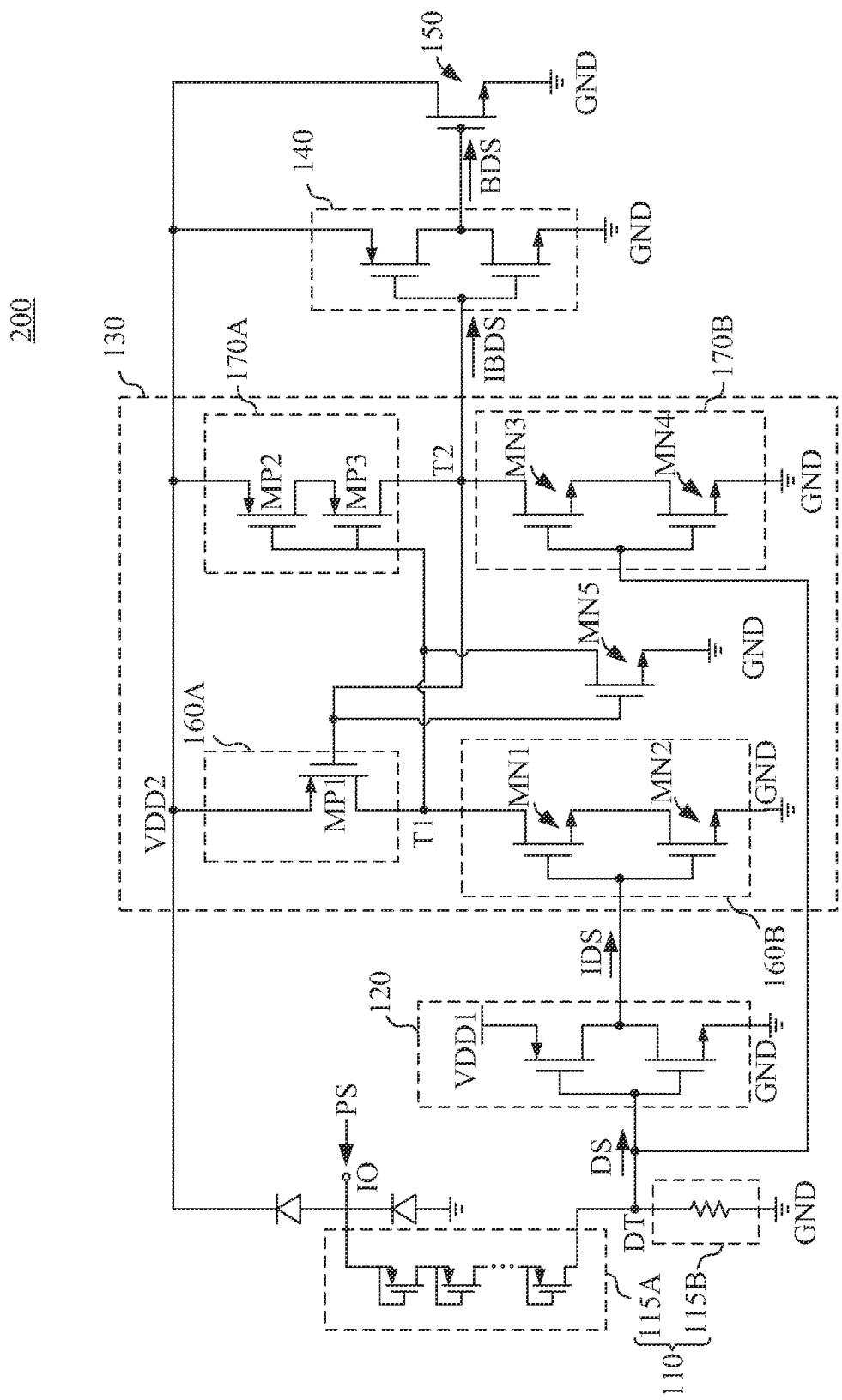
FIG. 2 illustrates a circuit diagram of an electrical discharge circuit having stable discharging mechanism according to another embodiment of the present invention.

Reference is now made to FIG. 2. FIG. 2 illustrates a circuit diagram of an electrical discharge circuit 200 having stable discharging mechanism according to another embodiment of the present invention.

Similar to the electrical discharge circuit 100 in FIG. 1, the electrical discharge circuit 200 in FIG. 2 includes the voltage division circuit 110, the first inverter 120, the voltage boosting circuit 130, the second inverter 140 and the ESD transistor 150. Further, the voltage boosting circuit 130 also includes the first PMOS circuit 160A, the first NMOS circuit 160B, the second PMOS circuit 170A and the second NMOS circuit 170B. As a result, the identical configurations and operations are not described herein.

In the present embodiment, the second PMOS circuit 170A includes two P-type transistors MP2 and MP3 coupled in series. Further, the voltage boosting circuit 130 further includes an N-type transistor MN5. The N-type transistor MN5 is electrically coupled between the first terminal T1 and the ground terminal GND and includes a third N-type transistor control terminal electrically coupled to the second terminal T2.

As described above, when the electrical discharge circuit 100 operates in the discharging mode, the second PMOS circuit 170A is turned off due to the voltage at the first terminal T1 that is at the high state level such that the second NMOS circuit 170B drains the current from the second terminal T2 to make the voltage at the second terminal T2 drop. The second inverter 140 inverts the inverted boost detection signal IBDS at the low state level to generate the boost detection signal BDS at the high state level to control the ESD transistor 150 to turn on.

When the voltage at the voltage input terminal IO is too high, the voltage difference between the source and the gate of the P-type transistor MP2 may become too high such that the P-type transistor MP2 turns on to charge the second terminal T2. The second terminal T2 that is supposed to be at the low state level (0) becomes unstable due to the charging and discharging of the second PMOS circuit 170A and the second NMOS circuit 170B. As a result, by disposing an additional P-type transistor MP3, the second PMOS circuit 170A has a higher resistibility against the voltage of the voltage input terminal IO and does not turn on easily due to the high voltage.

On the other hand, when the electrical discharge circuit 100 operates in the normal operation mode, the N-type transistor MN5 keeps the P-type transistor MP2 and MP3 of the second PMOS circuit 170A a more stable turn-on state to charge the second terminal T2 such that the voltage of the second terminal T2 increases. The second inverter 140 inverts the inverted boost detection signal IBDS at the high state level to generate the boost detection signal BDS at the low state level to steadily control the ESD transistor 150 to turn off.

In FIG. 2, two P-type transistors coupled in series included by the second PMOS circuit 170A are used as an example. In other embodiments, more than two P-type transistors can be included in the second PMOS circuit 170A to enhance the resistibility against the high voltage at the voltage input terminal IO. The present invention is not limited thereto.

It is appreciated that the embodiments described above are merely an example In other embodiments, it should be appreciated that many modifications and changes may be made by those of ordinary skill in the art without departing, from the spirit of the disclosure.

In summary, the present invention discloses the electrical discharge circuit having stable discharging mechanism that directly detects the voltage variation caused by the ESD input by disposing a voltage division circuit without the limitation of the RC circuit in conventional design. The electrical discharge circuit can quickly response and maintain a long enough discharging time to stabilize the discharging behavior of a discharging transistor.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:
1. A circuit comprising:
a voltage division circuit electrically coupled to a voltage input terminal configured to receive a power signal to generate a detection signal at a voltage division terminal;
a first inverter circuit configured to receive and invert the detection signal to output an inverted detection signal;
a voltage boosting circuit comprising:
a first PMOS circuit and a first NMOS circuit electrically coupled in series through a first terminal between the voltage input terminal and a ground terminal, wherein the first PMOS circuit comprises a first PMOS control terminal electrically coupled to a second terminal and the first NMOS circuit comprises a first NMOS control terminal configured to receive the inverted detection signal;
a second PMOS circuit and a second NMOS circuit electrically coupled in series through the second terminal between the voltage input terminal and the ground terminal, wherein the second PMOS circuit comprises a second PMOS control terminal electrically coupled to the first terminal and the second NMOS circuit comprises a second NMOS control terminal configured to receive the detection signal, and the second PMOS circuit further comprises a plurality of P-type transistors electrically coupled in series; and
an N-type transistor electrically coupled between the first terminal and the ground terminal and comprising a third N-type transistor control terminal electrically coupled to the second terminal;
a second inverter circuit electrically coupled between the voltage input terminal and the ground terminal and configured to receive and invert an inverted boost detection signal from the second terminal to output a boost detection signal; and
an electrostatic discharge (ESD) circuit electrically coupled between the voltage input terminal and the ground terminal and configured to be activated according to the boost detection signal for discharging the voltage input terminal.

2. The circuit of claim 1, wherein the first inverter circuit operates according to a first voltage, the voltage boosting circuit, the second inverter circuit and the ESD circuit operate according to a second voltage generated according to the power signal, wherein the first voltage is smaller than the second voltage, and the first voltage is either 0.9, 1.2 or 1.8 volts, the second voltage is 3.3 volts.

3. The circuit of claim 1, wherein the voltage division circuit comprises a first resistive circuit and a second resistive circuit electrically coupled in series through the voltage division terminal between the voltage input terminal and the ground terminal, wherein each of the first resistive circuit and the second resistive circuit comprises a resistor, a diode, a diode-connected transistor or a combination thereof.

4. The circuit of claim 1, wherein under a normal operation mode that a voltage amount of the voltage input terminal does not exceed a predetermined level, the detection signal is at a low state level, the inverted detection signal is at a high state level, the second PMOS circuit and the first NMOS circuit are turned off and the first PMOS circuit and the second NMOS circuit are turned off, the inverted boost detection signal is at the high state level, the boost detection signal is at the low state level, such that the ESD circuit turns off.

5. The circuit of claim 1, wherein under a discharging mode that a voltage amount of the voltage input terminal exceeds a predetermined level due to the receiving of an ESD input, the inverted detection signal is at a low state level, the second PMOS circuit and the first NMOS circuit are turned off and the first PMOS circuit and the second NMOS circuit are activated, the inverted boost detection signal is at the low state level and the boost detection signal is at the high state level, such that the ESD circuit turns on.

6. The circuit of claim 1, wherein each of the first NMOS circuit and the second NMOS circuit comprises a first N-type transistor and a second N-type transistor electrically coupled in series, wherein the first N-type transistor is an I/O device, and the second N-type transistor is a core device.

7. The circuit of claim 1, wherein the second voltage is generated from the power signal and the first voltage is generated from another independent voltage source.

8. The circuit of claim 1, wherein the second voltage is generated from the power signal and the first voltage is generated by dividing the power signal.

* * * * *